March 23, 1965 R. PRICHARD 3,175,130

PULSE DIVIDING CIRCUIT

Filed June 19, 1961

INVENTOR.
ROY PRICHARD

BY

ATTORNEY

United States Patent Office 3,175,130
Patented Mar. 23, 1965

3,175,130
PULSE DIVIDING CIRCUIT
Roy Prichard, Lockport, Ill., assignor to International Telephone and Telegraph Corporation, New York, N.Y., a corporation of Maryland
Filed June 19, 1961, Ser. No. 117,926
6 Claims. (Cl. 317—140)

This invention relates to all-relay logic modules and more particularly to electromechanical pulse dividing circuits.

Recent engineering efforts have been directed to an adoption of logic circuit concepts so that standardized subassemblies may be combined to provide a unique overall effect. Primarily, these engineering efforts have been most pronounced in the field of electronics and very little, if any, attention has been directed to applying similar concepts to other scientific fields. A particular non-electronic field well adapted to an application of logic concepts is the electromechanical or relay field. For example, automatic telephone relay switching circuitry is especially well adapted to use of the Boolean algebraic concepts of circuit analysis which make logic circuitry possible.

One of the logic functions which is often required in these relay switching circuits and which is especially well adapted to logic circuitry techniques is provided by a pulse dividing circuit. These pulse dividing circuits are, generally speaking, circuits which convert input pulses that recur at a first pulse repetition rate into output pulses having a second or slower pulse repetition rate. Usually the input pulses are cyclic in nature; although, they may be random pulses also. For example, if input pulses are received at a cyclic rate of 60 pulses per second, a pulse dividing circuit which divides by "two" produces output pulses of 30 pulses per second. And, in the same circuit, random input pulses are counted and an output pulse appears after every second input pulse is received.

Existing relay pulse dividing circuits generally include double-wound relays which are subject to unbalance under marginal conditions. For example, one very well known and widely used pulse dividing circuit requires a differential relay. Another requires two-step relays. If, for any reason, the circuit values change sufficiently, these double-wound relays are unbalanced and fail to function properly. Therefore, the existing relay pulse dividing circuits require closely controlled environmental conditions. This, of course, defeats the purpose of logic modular design, which must function properly in virtually any environment.

Accordingly, an object of this invention is to provide a new and improved all-relay pulse dividing circuit. More particularly, an object of this invention is to provide a non-marginal pulse dividing circuit utilizing only single-wound relays adapted to operate upon the completion of a circuit between ground and battery despite wide fluctuations in circuit parameters.

Another object of this invention is to provide low cost relay pulse dividing circuits which are so economical to build that they may be widely used in modular circuitry. In this connection, an object is to enhance the reliability required in circuitry having such a wide and varied usage.

Yet another object of this invention is to provide an all-relay logic circuit module of universal application which is capable of performing many different logic functions in many different circuits and under a great variety of circuit conditions. Here, an object is to provide a free-running pulse divider which may also double as a pulse counter and be inhibited under a number of output conditions by a selective application of inhibiting control signals. Moreover, an object is to provide a logic module having two output signals, which module may be primed to a mid-point in its cyclic operation, thus selectively displacing the two output signals by 180° in the operating cycle of the module.

In accordance with one aspect of this invention, an all-relay pulse dividing circuit is provided with three input terminals and two output terminals. A first of the input terminals is cyclically energized from any suitable pulse source to operate and release a first or pulsing relay. This pulsing relay, in turn, operates two other relays which have their contacts connected to provide interlocking control over the relay positions. Contacts on these two other relays provide output pulse signals at the two output terminals, the output pulses recurring at a pulse repetition rate which is one-half the pulse repetition rate of the input pulses. If either of the other two input terminals is energized by an inhibiting control signal, one of the two relays is held operated to supply any of a number of output signals to the two output terminals.

The above mentioned and other features and objects of this invention and the manner of obtaining them will become more apparent and the invention itself will be best understood by reference to the following description of an embodiment of the invention taken in conjunction with the accompanying drawings in which.

Figure 1:
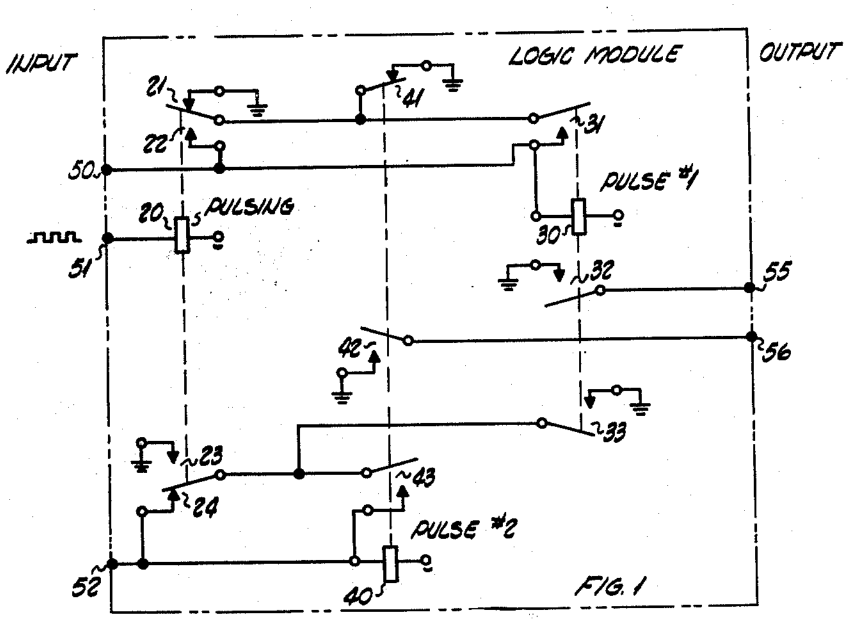
FIG. 1 is a schematic circuit diagram showing the circuit of an all-relay logic module.

By an inspection of FIG. 1, it is seen that the only components required by this invention are three single-wound relays 20, 30, and 40. A first or pulsing one of these relays 20 has a pair of "C" contacts 21–24; the second of these relays 30 has three "A" contacts 31–33; and the third of these relays 40 has a pair of "A" contacts 42, 43 and a single "B" contact 41. As those skilled in the art know, an "A" contact (such as 31) is a combination of relay-controlled springs having single-throw, normally open contacts which make an electrical circuit when a relay operates. A "B" contact (such as 41) is a combination of relay-controlled springs having single-throw, normally closed contacts which break a circuit when a relay operates. A "C" contact (such as 21, 22) is a combination of relay-controlled springs having a make-break, double-throw contact combination which opens one circuit and closes another when a relay operates. These contacts are interconnected so that the first relay is free-running and the second and third relays provide interlocking control over each other responsive to the operation of the first relay.

Figure 2:
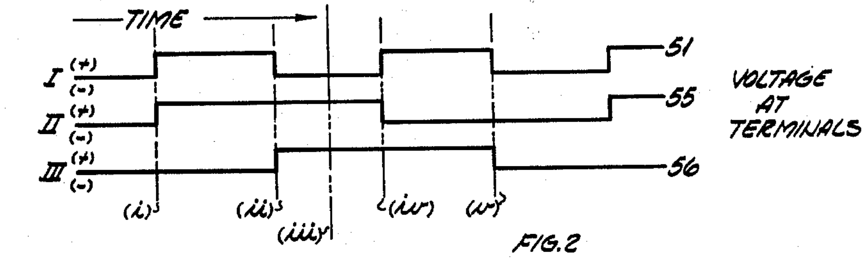
FIG. 2 is a graph with voltage plotted along the vertical axis and time plotted along the horizontal axis to show the relation between the input and output signals.

This all-relay logic module also includes three input terminals 50–52 and a pair of output pulses, 55, 56. Any suitable source of cyclically recurring terminals is connected to energize a first of the input terminals 51 by sequentially recurring D.C. pulses as shown in Curve I (FIG. 2). In this and the other curves, the polarities of the various voltages are indicated by simple (+) and (−) signs; however, no other particular significance should be attached to these signs.

In carrying out this invention, the three relays of the logic module are driven by these recurring pulses to produce voltages at the two output terminals. These output voltages are time-displaced pulses having a pulse repetition rate which is equal to one-half of the repetition rate of the input pulses. It is thought that this feature of the invention will be understood best by the following description of the operation of the relays as they are driven through their operate cycles.

When the pulsing relay operates, it attracts its uppermost "C" contact armature and completes a circuit at 22 for operating the pulse #1 relay 30, the circuit being traced from ground through resting "B" contacts 41 on the pulse #2 relay 40, operated "C" combination contacts 22 on the pulsing relay 20, and the winding of pulse #1 relay 30 to battery. When relay 30 operates, its uppermost "A" contacts 31 complete its locking circuit to the ground on the contacts 41. The next "A" contacts 32 close a circuit to apply ground to a first output terminal 55, as shown at point (*i*), Curve II (FIG. 2). Finally, the lowermost "A" contacts close to prepare a locking circuit for pulse #2 relay, which has not yet operated. The circuit is now in the condition shown by the curves of FIG. 2 at point (*i*) and nothing further happens until the input pulse applied to the first input terminal 51 terminates.

The pulsing relay 20 falls back at the end of the input pulse to complete an alternate locking circuit for pulse #1 relay 30 at contacts 21. The lower "C" combination armature falls and completes a circuit traced from the ground on the "A" contacts 33 through contacts 24, and the winding of pulse #2 relay 40 to battery. Relay 40 operates and, at its uppermost "B" contacts 41, opens the locking circuit of pulse #1 relay 30. However, relay 30 holds from the ground on closed "C" contacts 21 of the released pulsing relay. At its center "A" contacts 42, relay 40 closes a circuit for energizing the second output terminal 56, as shown at point (*ii*), Curve III (FIG. 2). Finally, at its lowermost "A" contacts 43, the pulse #2 relay completes its locking circuit.

When the next input pulse appears at the first input terminal 51, the pulsing relay operates, as shown at point (*iv*), Curve I (FIG. 2). Upon reoperation, the pulsing relay opens the holding circuit for the pulse #1 relay 30 at its uppermost "C" contacts 21. Thus, the pulse #1 relay releases to complete one-half of its "make-break" cycle in response to the completion of a full "make-break" cycle of relay 20. At its lowermost "C" contacts 23, the pulsing relay closes an alternate holding path for the pulse #2 relay 40. The circuit values are such that the pulse #2 relay is locked operated by ground from the pulsing relay contacts 23 before the pulse #1 relay drops its lowermost "A" contacts 33. At this time, the release of relay 30 causes "A" contacts 32 to terminate the ground potential applied to the first output terminal 55, as shown at point (*iv*), Curve II (FIG. 2).

Upon termination of this pulse at the first input terminal 51, the pulsing relay 20 drops. The uppermost "C" contacts 22 restore without effect because the pulse #1 relay "A" contacts 31 are open. The lowermost "C" contacts 23 open, thus breaking the locking circuit for the pulse #2 relay 40, which also restores to de-energize the second output terminal as shown at point (*v*), Curve III (FIG. 2). Again it should be noted that one-half of the "make-break" cycle of relay 40 is completed after a full "make-break" cycle of relay 20.

The entire cycle described above repeats when the next two input pulses are received at terminal 51. Hence, as shown by the curves of FIG. 2, the two output terminals 55, 56 are energized by cyclically recurring pulses having a pulse repetition rate equal to one-half the pulse repetition rate of the input pulses applied to terminal 51. Moreover, as shown by the displacement between points (*i*), (*ii*) of these Curves II and III, the two output signals are displaced in time by an interval equal to the duration of one input make pulse at terminal 51.

Means are provided for inhibiting the operation of the all-relay circuit to provide one of a number of output conditions. For example, if an inhibiting control signal, in the form of ground potential, is applied to the uppermost input terminal 50, the pulse #1 relay 30 holds operated. This maintains the ground potential applied to terminal 55 by operated "A" contacts 32. When the pulse #2 relay 40 next operates, it is locked by the ground applied from the lowermost "A" contact 33. Thereafter, no further operation of the pulsing relay 20 can have any effect until the inhibiting control signal is removed from terminal 50. Thus, an appearance of a control signal at the upper inhibit terminal 50 has the effect of first energizing the upper output terminal 55; and, after a time displacement period equal to the width of one input make pulse, the lower output terminal 56 is energized.

An application of an inhibiting control signal, again in the form of ground potential, to the lowermost inhibit terminal 52 holds the pulse #2 relay in an operated condition, thus removing the pulse #1 relay locking ground at contacts 41. After these contacts open, it is not possible to operate pulse #1 relay 30 from the pulsing relay contacts 22. This being the case, an application of an inhibit signal at the terminal 52 at a time when the pulse #1 relay 30 is released has the effect of energizing the lowermost output terminal 56 but not the uppermost output terminal 55. If terminal 52 is energized when relay 30 is operated, the effect is to release relay 30 and de-energize terminal 55 when the next input pulse appears at terminal 51 and thereafter to prevent further energization of terminal 55 until the inhibiting control signal is removed from terminal 52.

Means are provided for priming the logic circuit to reverse the order in which output signals appear at the output terminals 55, 56. To accomplish this reversal, it is only necessary to pulse the terminal 50 long enough to operate the pulse #1 relay 30. Thereafter, the initial circuit condition is that shown at point (*iii*) (FIG. 2), and the next input pulse produces the effects shown at point (*iv*).

Figure 3:
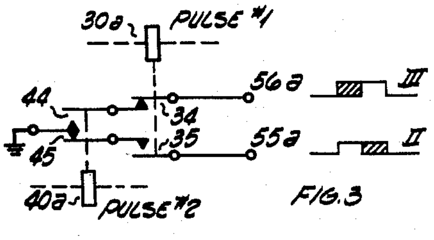
FIG. 3 shows alternative contacts for relays shown in FIG. 1 together with voltage diagrams indicating how the output pulses of FIG. 2 have been modified.

Yet another way to modify the output signal is to provide other contact options on the pulse relays. As shown in FIG. 3, relays **30*a*, 40*a* exactly correspond to relays 30, 40 except for the substitution of contacts 34, 35, 44, 45 for contacts 32, 42 respectively. The output terminal 55*a* is energized when pulse #1 relay 30*a* operates to close contacts 35 and de-energized when pulse #2 relay 40*a* operates to open contacts 45** (i.e. between points (*i*) and (*ii*) of FIG. 2). Terminal **56*a* is energized when relay 40*a* is operated and relay 30*a*** is released (i.e. between points (*iv*) and (*v*) of FIG. 2). The effect is to maintain the pulse repetition rate shown in FIG. 2, but to shrink the output pulse width to that of the input pulse. Thus, the circuit functions as described in connection with FIGS. 1 and 2 except that the cross-hatched areas (FIG. 3) are chopped out of the output pulses of Curves II and III.

In keeping with the teaching of this invention, a number of modules may be cascaded and the various output signals may be fed into the various input terminals to produce a desired change of Boolean logic functions. The nature of this change depends upon the needs of a particular circuit; therefore, those skilled in the art are expected to select required terminals which are to be strapped.

Figure 4:
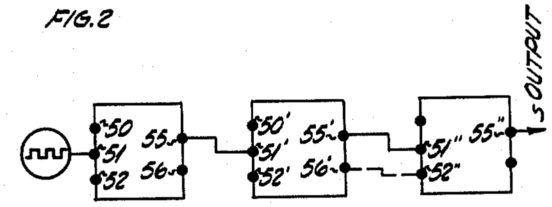
FIG. 4 is a block diagram showing how modules may be cascaded and strapped to provide modifications of Boolean logic.
Figure 5:
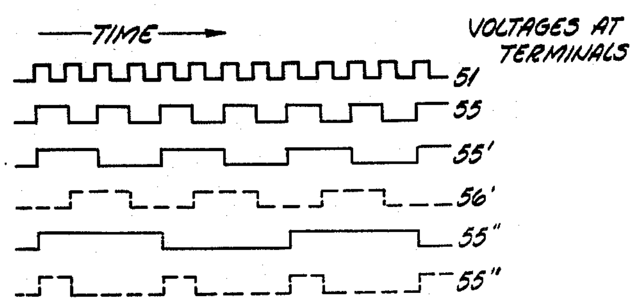
FIG. 5 is a graph showing the voltages produced in the block diagram of FIG. 4.

To illustrate one possible combination of cascaded modules, reference is made to FIGS. 4, 5. As shown in FIG. 4, three identical modules, each having the circuitry of FIG. 1, are cascaded with each pulsing input terminal 51 strapped to the output terminal 55 of the preceding module. The driving source is connected to the input terminal 51 of the first module and the final output signal is taken from the output terminal 55″ of the last cascaded module. As will be apparent from the foregoing description of FIG. 2, the voltages appearing at the various terminals are those shown by the solid line curves of FIG. 5. Thus, the output voltage goes positive at terminal 55″ responsive to the receipt of eight input pulses at terminal 51.

To modify this output signal, additional strappings are connected between various input and output terminals of the cascaded modules, for example, with the output shown by the solid line curves of FIG. 5, each output pulse at terminal 55″ has a duration equal to four input pulses periods. To limit the duration of this output pulse at 55″, terminal 56′ and 52″ are strapped to change the output voltages to those shown by dashed lines FIG. 5. Thus, it is apparent that each output pulse at terminal 55″ is reduced to a duration equal to one complete input pulse cycle. An additional strapping between terminals 56, 52″ would further shrink the duration of the output pulses at 55″ to the width of an input make pulse at terminal 51. Account should, of course, be taken of the accumulated operate and release times of the relays; however, the extremely light spring loading on each relay reduces this timing to a minimum.

An advantage of this invention is that a minimum number of relay contacts perform a maximum amount of Boolean logic functions in a module which may be constructed as a unitary device for plugging into other associated relay circuitry. Only single-wound relays are employed to provide a pulse divider circuit which operates with extreme reliability despite widely fluctuating loading conditions which might otherwise present unbalances during marginal operating conditions that would upset the operation of conventional circuits. Moreover, the invention lends itself to modern fabrication techniques which afford economies by standardization of pieceparts and unitary mounting brackets. Finally, all of this is accomplished without sacrificing the ability to use the more traditional circuit design and fabrication techniques. That is, the all-relay circuit does not require module construction. Quite the contrary, the circuit shown in the attached drawing may be incorporated into any circuit requiring pulse dividing and counting functions. Moreover, a plurality of these relay circuits of either modular or traditional construction may be cascaded to increase the count capacity and signals may be fed back from any output terminal to any input terminal to modify the count cycle.

It is to be understood that the foregoing description of a specific embodiment of the invention is not to be construed as a limitation upon its scope.

I claim:

1. An all-relay pulse dividing circuit having three input terminals and two output terminals, means for cyclically energizing a first of said input terminals by sequential pulses having a first pulse repetition rate, means responsive to said sequential pulses for operating said all-relay dividing circuit to energize said two output terminals by time displaced cyclically recurring pulses having a second pulse repetition rate that is equal to one-half that of the first pulse repetition rate, and means responsive to first control signals applied to a second one of said input terminals for inhibiting the response of said all relay circuit to said sequential pulses and for energizing one of said output terminals for the duration of said first control signals, and means responsive to second control signals applied to a third one of said input terminals for inhibiting the response of said all relay circuit to said sequential pulses and for energizing the other one of said output terminals for the duration of said second control signals.

2. The all-relay circuit of claim 1 wherein said all-relay circuit consists of three single-wound relays having a plurality of interconnected contacts, one of said relays having a pair of "C" contacts, a second of said relays having three "A" contacts, and a third of said relays having two "A" contacts and one "B" contact.

3. An all-relay pulse dividing circuit consisting of three single-wound relays having a plurality of interconnected contacts, a first of said relays having two "C" contacts, a second of said relays having three "A" contacts, and a third of said relays having two "A" contacts and one "B" contact, means for energizing a first of said relays by sequentially recurring pulses having a predetermined repetition rate, means responsive to a first operation of said first relay for operating a second of said relays, means responsive jointly to the operation of said second relay and release of said first relay for operating said third relay, means responsive to the reoperation of said first relay for releasing said second relay, means responsive to the reoperation of said first relay for holding said third relay after release of said second relay, means thereafter responsive to release of said first relay for releasing said third relay whereby contacts on said second and third relays energize two output terminals by time displaced cyclically recurring pulses having a pulse repetition rate equal to one-half of the pulse repetition rate at which said first relay operates, and means responsive to the receipt of a first inhibit signal for holding said second relay and said third relay operated to energize both of said output terminals.

4. An all-relay pulse dividing circuit consisting of three single-wound relays having a plurality of interconnected contacts, a first of said relays having a pair of "C" contacts, a second of said relays having three "A" contacts, and a third of said relays having two "A" contacts and one "B" contact, the make contact of a first of said "C" contacts being connected to the winding of said second relay, the break contact of the second of said "C" contacts being connected to the winding of said third relay, the break contact of the first of said "C" contacts and said "B" contacts being connected in a first parallel circuit and said first parallel circuit being connected in series with one of said "A" contacts and the winding on said second relay, the make contact of said second "C" contacts being connected in a second parallel circuit with another of said "A" contacts on said second relay and said second parallel circuit being connected in series with one of said "A" contacts and the winding on said third relay, means for cyclically energizing said first relay responsive to sequentially recurring pulses, and means responsive to operation of said second and third relays for providing two output signals of time displaced cyclically recurring pulses having a pulse repetition rate equal to one-half of the pulse repetition rate of said sequentially recurring pulses.

5. An all relay pulse dividing circuit having at least two input terminals and two output terminals, means for cyclically energizing a first of said input terminals by sequential pulses having a first repetition rate, means responsive to said sequential input pulses for operating said all relay pulse dividing circuit to energize said two output terminals by time display cyclically recurring pulses having a second pulse repetition rate that is equal to one half of the first pulse repetition rate, and means responsive to control signals applied to a second one of said input terminals for inhibiting a response of said all relay circuit to said sequential pulses and for energizing only one of said output terminals for the duration of said control signals applied to said second input terminal.

6. An all-relay pulse dividing circuit consisting of three single-wound relays having a plurality of interconnected contacts, a first of said relays having two "C" contacts, a second of said relays having three "A" contacts, and a third of said relays having two "A" contacts and one "B" contact, means for energizing a first of said relays by sequentially recurring pulses having a predetermined repetition rate, means responsive to a first operation of said first relay for operating a second of said relays, means responsive jointly to the operation of said second relay and release of said first relay for operating said third relay, means responsive to the reoperation of said first relay for releasing said second relay, means responsive to the reoperation of said first relay for holding said third relay after release of said second relay, means thereafter responsive to release of said first relay for releasing said third relay whereby contacts on said second and third relays energize two output terminals by time displaced cyclically recurring pulses having a pulse repetition rate equal to one-half of the pulse repetition rate at which said first relay operates, and means responsive to the receipt of a second inhibit signal for holding third relay operated to energize one of said output terminals.

References Cited by the Examiner

UNITED STATES PATENTS

| | | | |
|---|---|---|---|
| 2,561,073 | 7/51 | Schouten et al. | 317—140 |
| 2,814,003 | 11/57 | Alizon | 317—140 |
| 3,067,363 | 12/62 | Fleckenstein | 321—70 |

OTHER REFERENCES

AIEE Technical Paper 49–148, May 4, 1949.
AIEE Technical Paper 51–350, Sept. 6, 1951.

SAMUEL BERNSTEIN, *Primary Examiner.*